United States Patent [19]

Sheng et al.

[11] 4,001,723
[45] Jan. 4, 1977

[54] OSCILLATOR CIRCUITS

[75] Inventors: Abel Ching Nam Sheng, Morris Plains; Max Edward Malchow, Flemington, both of N.J.

[73] Assignee: RCA Corporation, New York, N.Y.

[22] Filed: Dec. 8, 1975

[21] Appl. No.: 638,846

[52] U.S. Cl. .............................................. 331/111
[51] Int. Cl.² ........................................ H03K 4/50
[58] Field of Search .......... 331/111, 143, 112, 113, 331/144, 146

[56] References Cited
UNITED STATES PATENTS

| | | |
|---|---|---|
| 3,526,853 | 9/1970 | Vittoz ............................. 331/111 |
| 3,882,421 | 5/1975 | Stein ............................... 331/111 |
| 3,916,343 | 10/1975 | Suzuki ............................. 331/111 |

*Primary Examiner*—John Kominski
*Attorney, Agent, or Firm*—H. Christoffersen; S. Cohen; K. Watov

[57] ABSTRACT

A micropower, latch-up free, relaxation oscillator includes a switch such as a programmable unijunction transistor or a silicon-controlled-switch. The switch is coupled at its gate electrode via an emitter-follower circuit of low output impedance, to a source of reference potential provided by a relatively high resistance resistive voltage divider. The condition of the switch, whether conducting or not, is controlled by a resistor-capacitor timing circuit. When the capacitor charges to a given level, it causes the switch to conduct and to act as a discharge circuit for the capacitor. When the capacitor discharges to a second level, the switch goes off and the cycle then repeats.

13 Claims, 7 Drawing Figures

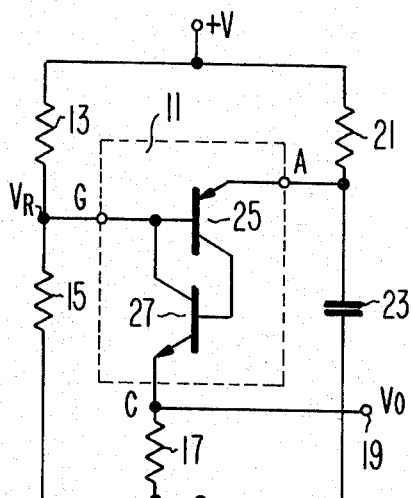
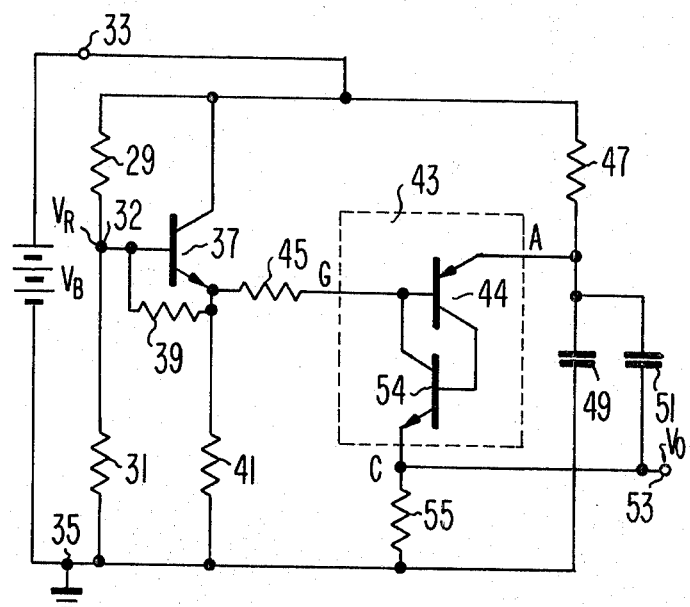
PRIOR ART
Fig.1
Fig.2A
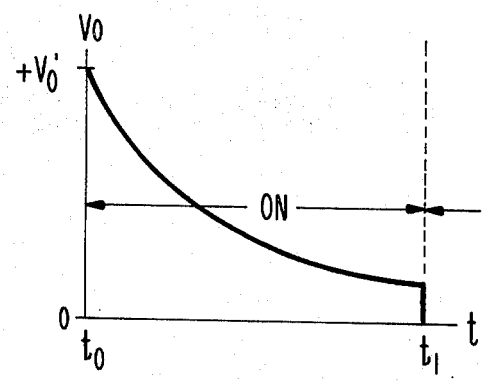
Fig.2B
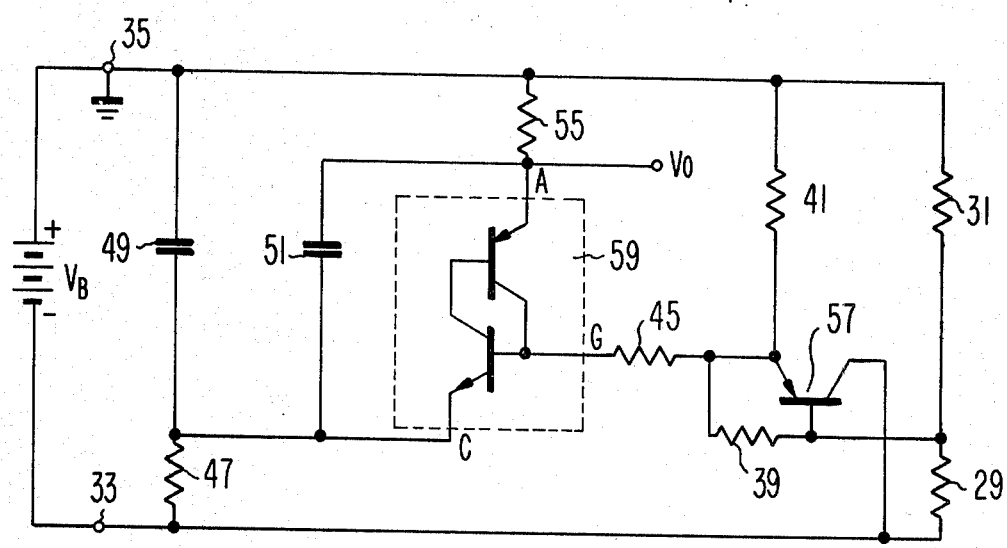
Fig.3A

OSCILLATOR CIRCUITS

The present invention deals generally with oscillator circuits, and more specifically, with solid-state relaxation oscillators including solid-state switches, such as a programmable unijunction transistor, or a silicon controlled rectifier.

In the drawings:

FIG. 1 is a circuit schematic diagram of a prior art relaxation oscillator including a programmable unijunction transistor;

FIG. 2A is a circuit schematic diagram of one embodiment of a micropower relaxation oscillator of the present invention including a programmable unijunction transistor (PUT);

FIG. 2B shows a portion of the output signal waveform of the circuit of FIG. 2A;

FIG. 3A is a circuit schematic diagram of another embodiment of the micropower relaxation oscillator of the present invention including a silicon-controlled-rectifier (SCR);

Figure 3B:
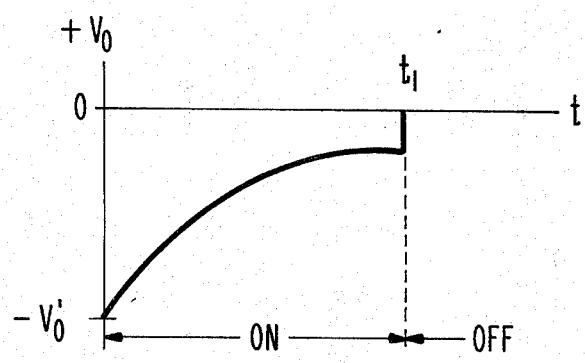
FIG. 3B shows a portion of the output signal waveform of the oscillator circuit of FIG. 3A.
Figure 4:
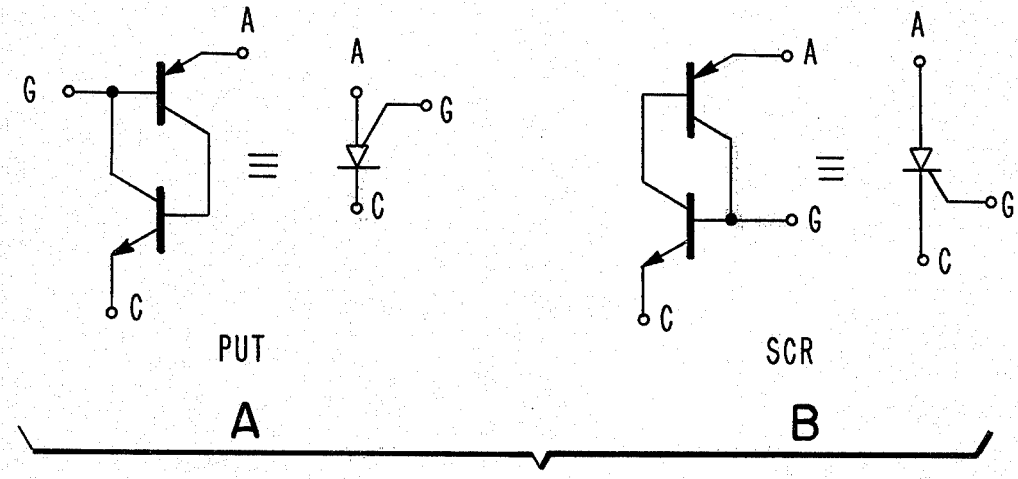
FIG. 4A shows the equivalent circuit diagram for a PUT as used in FIG. 2A, and the standard circuit symbol for a PUT.
FIG. 4B shows the equivalent circuit diagram for an SCR as used in FIG. 3A, and the standard circuit symbol for an SCR.

Many battery-operated electronic devices such as smoke detectors, for example, include relaxation oscillators. Such devices are usually designed to draw only small amounts of current to obtain longer life from the battery and therefore, are often called "micropower" devices.

A typically known oscillator circuit which would be useful in such devices except for its excessive power consumption is shown in FIG. 1. It includes a programmable unijunction transistor 11 (hereinafter referred to as a PUT) shown in its equivalent circuit diagram form to include two interconnected transistors 25, 27 of opposite conductivity. The anode, cathode and gate electrodes of the PUT are identified by the letters A, C, and G, respectively.

In the operation of the oscillator of FIG. 1, assume that the PUT 11 is turned off and that capacitor 23 is substantially discharged. When the positive voltage +V is applied across the circuit, as shown, capacitor 23 will begin charging via resistor 21, exponentially increasing the potential at the anode (A) of PUT 11. When this potential exceeds the value of the reference voltage $V_R$ (established at the gate electrode of PUT 11 by the series connected resistive voltage divider 13, 15) by $1V_{BE}$ of transistor 25, PUT 11 will turn on. Capacitor 23 then discharges through the two main current paths of the PUT 11, one path including the collector and emitter electrodes of transistor 25, and the base and emitter electrodes of transistor 27, the other path including the emitter and base electrodes of transistor 25, and the collector-emitter electrodes of transistor 27. When capacitor 23 has discharged to a point such that the anode of the PUT is at a voltage level less than $1V_{BE}$ above the voltage at the gate electrode G, the PUT turns off. Thereafter, the cycle is repeated as the capacitor 23 begins to once again charge via the current flow from the positive supply +V through resistor 21.

As mentioned briefly above, the relaxation oscillator circuit of FIG. 1 is not a micropower relaxation oscillator. Its resistors 13, 15, and 21, are of relatively low values so that substantial current always flows in the circuit. If the values of resistors 13, 15, and 21 are increased to minimize the amount of current drawn from the positive voltage supply +V, the PUT 11 once on, latches in the on condition. After the capacitor 23 has discharged sufficiently so that its discharge current no longer flows, into the anode electrode of the PUT 11, the current passing through resistor 21 continues to flow into the anode and keeps the PUT 11 in a conducting state. The reason is that once PUT 11 turns on, the resistance between gate G and ground is low-equal to substantially that of resistor 17 which is a relatively low value of resistance. (The resistance of the emitter-collector path of transistor 27 is low and may be ignored.) As the resistance of resistor 13 is high, the gate voltage of the PUT 11 is very low, close to ground, and transistor 25 is highly forward biased. Therefore, the anode voltage level will reach a sufficiently low level by the time discharge current stops flowing from capacitor 23 to turn off the PUT 11 and the current flowing through resistor 21 into the anode will sustain conduction through the PUT 11, because PUT 11 has a low holding current (current level required to flow from emitter to base of transistor 25 to collector of transistor 27, and from emitter-collector current path of transistor 25, through base-emitter path of transistor 27, to maintain conduction of PUT 11).

When PUT 11 is on, the collector-emitter current path of transistor 27 has a very low resistance, and resistor 17 may be considered to be connected directly across resistor 15. The resulting resistance between the gate of PUT 11 and ground is substantially less than the resistance of resistor 13. Thus the voltage at the gate electrode of PUT 11 when the PUT is on, is much lower than $V_R$ when PUT 11 is off. The PUT once turned on is held on by the holding current supplied via resistor 21 to the anode electrode of PUT 11 and oscillations stop.

If the value of resistor 13 is reduced, to say 1/10 the value of resistor 21, the current supplied to the gate electrode of PUT 11 (which is the collector current of transistor 21) is increased by a factor of 10. This increased collector current causes transistor 27 to come out of saturation (or to become less saturated), assuming the current supplied to the base electrode of transistor 27 to remain substantially constant. This increased current flow causes the voltage across the collector-to-emitter path of transistor 27 to increase in value. This increased voltage turns off transistor 25, turning off PUT 11.

While the fix above, that is reducing the resistance of resistor 13 by a factor of ten, causes PUT 11 to turn off, it introduces a second problem, namely that PUT 11, after turning off, will not turn on again. The reason is that the reference voltage $V_R$ is substantially increased to a value such that $[V_A-V_R]$ is less than $1V_{BE}$. So again the oscillations stop.

If the value of resistors 13, 15, and 21 are all reduced, oscillatory operation of PUT 11 results, without latch-up. The reason is that the operating currents now supplied by resistor 13 and 21 are high enough to cause the transistor action of transistor 27 to be incidental, provided that the current supplied via resistor 13 is maintained about ten times that supplied via resistor 21 to PUT 11 in the on condition. In other words, transistor 27 does not become so highly saturated in the on state of PUT 11, that the PUT 11 cannot be turned-off; and the reference voltage $V_R$ (applied to the gate of PUT 11) is of low enough value in the off-state of PUT 11, to permit the voltage at the anode electrode of PUT 11 to rise more than $1V_{BE}$ higher than the gate voltage, for turning on the PUT 11. But, as already mentioned, the power consumption is higher than can be tolerated in many applications.

FIG. 2A illustrates a micropower relaxation oscillator circuit embodying one form of the invention. This oscillator includes a pair of resistors 29 and 31 connected in series between power or voltage terminals 33 and 35. A battery $V_B$ is connected with its positive terminal to power terminal 33 and its negative terminal to power terminal 35. The voltage $V_r$ is developed at the tap 32 of the voltage divider 29, 31. An NPN transistor 37 is connected as an emitter-follower having a base electrode connected to the tap 32, a collector electrode connected to terminal 33, and an emitter electrode connected via resistor 39 to its base electrode, and via resistor 41 to terminal 35. A PUT 43 has a gate electrode (G) connected via resistor 45 to the emitter electrode of transistor 37, an anode electrode (A) coupled via resistor 47 to terminal 33, via capacitors 49 and 51 to terminal 35 and output terminal 37, respectively, and a cathode electrode (C) connected to output terminal 53, and coupled via resistor 55 to terminal 35.

In FIG. 2A, the values of resistors 29, 31, and 47 are chosen to be substantially higher than the resistance values of their circuit counterparts 13, 15, and 21, respectively, in the circuit of FIG. 1. Typical values of the circuit components for FIGS. 2A and 3A are given in Table 1 which follows.

TABLE I

| Reference Numeral | Component Type | Value* |
|---|---|---|
| $V_B$ | Battery | 11 volts |
| 29 | Resistor | 200K |
| 31 | Resistor | 300K |
| 37 | NPN Transistor | Part of CA3097 |
| 39 | Resistor | 100K |
| 41 | Resistor | 2M |
| 43 | Programmable Unijunction Transistor | Part of CA3097 |
| 45 | Resistor | 30K |
| 47 | Resistor | 3.6M |
| 49 | Capacitor | 20 |
| 51 | Capacitor | 0.01 |
| 55 | Resistor | 5.6K |
| 57 | Transistor | Part of CA3097 |
| 59 | Silicon Controlled Rectifier | Part of CA3097 |

*All resistor values are in ohms, and all capacitor values are in microfarads.

In operation, assume that capacitor 49 initially is discharged and PUT 43 is off. When the supply voltage $V_B$ is applied across terminals 33 and 35, as shown, the reference voltage $V_R$ applied to the base of transistor 37 turns this transistor on. It applies a forward bias voltage via resistor 45 to the gate electrode of the PUT 43. The value of this voltage is $V_R-1V_{BE}$, where $V_{BE}$ is the base-emitter offset voltage of transistor 37. At the same time, capacitor 49 exponentially begins to charge via resistor 47. When capacitor 49 has charged to a level $1V_{BE}$ of transistor 44 greater than the forward bias voltage applied to the gate electrode of PUT 43, the latter turns on. That is, in equivalent circuit terms, its transistors 44 and 54 turn on and the capacitor 49 discharges through the two current paths as already discussed. The output voltage $V_o$ now decreases substantially exponentially in value (due to the discharge of capacitor 49) until time $t_1$, when the PUT 43 turns off. When PUT 43 turns off, the output voltage $V_o$ goes to ground because the flow of current through resistor 55 terminates.

The circuit of FIG. 2A draws substantially less current or power than the circuit of FIG. 1 because of the relatively higher values of resistors 29, 31, and 47. The latch-up problem is overcome through the use of the emitter-follower circuit including transistor 37. In this circuit, the relatively high impedance of the high resistance voltage divider 29, 31 is transformed to a relatively lower value as viewed from the gate electrode of the PUT 43 and this reduces the amount of forward bias on the PUT 43 when in the on condition. Using the values of resistors shown in the table, in the FIG. 1 circuit the gate voltage $V_G$ when PUT 11 is on, is:

$$V_G = \frac{R_{17}}{R_{17}+R_{13}} \times V_B = \frac{5.6}{205.6} \times 11 = 0.3 \text{ volts}.$$

In the circuit of FIGS. 2A and 3A, $$V_G = \frac{R_{55}}{R_{45}+R_{55}} \left(V_R - 1V_{BE}\right) = \left(\frac{5.6}{30+5.6}\right)\left(6.6-0.6\right) = 0.92 \text{ volts}.$$

Thus, in the circuit of FIG. 2A because of the impedance transformation provided by the emitter-follower circuit, the PUT 43, when on, is not as highly forward biased as the PUT 11 in the FIG. 1 circuit, and does not tend to latch in the on condition.

Capacitor 51 is added to the oscillator circuit of FIG. 2A, for the typical circuit parameters given in Table 1, whenever the $\beta$ of the NPN transistor 54 of PUT 43 has a value greater than 300. When the $\beta$ of this transistor 54 is greater than 300, the emitter-follower circuit including NPN transistor 37 does not provide sufficient current to the gate electrode of PUT 43 to prevent the PUT 43 from latching. In other words, the capacitor 49 discharge current will be unable to drive the anode sufficiently close to ground to reduce the anode to gate voltage to less than $1V_{BE}$ and the current through resistor 47 will cause the PUT 43 to continue to conduct. Capacitor 51 is added as shown to provide positive feedback for insuring the proper turn off of PUT 43, as will be described in detail later.

Resistor 39 is included in the circuit of FIG. 2A, to compensate for any leakage current which may flow from the collector electrode to the base electrode of NPN transistor 37. When transistor 37 is turned off, this leakage current ($I_{CB}$) may reach values sufficiently high to turn on transistor 37, causing false turn on and interrupting the proper operation of the relaxation oscillator. Resistor 39 prevents such false turn on, by insuring that the turn-on current must exceed a value of the $V_{BE}$ of transistor 37 divided by the value of resistor 39. Emitter-resistor 45 is chosen to provide a desired value of $V_G$, when PUT 43 goes on and also limits the magnitude of the current delivered to the gate electrode of PUT 43.

The circuit of FIG. 2A may be analyzed in terms of currents. The source impedance of the reference voltage $V_R$ source is $(R_{29}/\beta_{37} + R_{45})$. In this example, the value of resistor 45 is about 1/10 the value of resistor 29, and the $\beta$ of transistor 37 is about 200; therefore, resistor 45 is the predominant resistance. Accordingly, the gate current $I_G$ available for turn off has a magnitude of:

$$I_G = \frac{V_B}{(R_{29}/\beta_{37} + R_{45})}, \qquad (1)$$

which is sufficient to overcome the tendency of the holding current delivered to the gate of PUT 43 via resistor 47 and the anode-electrode to maintain the PUT conductivity.

With PUT 43 turned off, transistor 37 would also turn off were it not for the presence of emitter resistor 41. The reason it would tend to turn off is because there would be an open circuit between its emitter electrode and ground, as transistor 54 would be off. However, in the present circuit, when PUT 43 goes off, transistor 37 stays on, with only a trickle of current flowing through its base-emitter and collector emitter paths. Note that resistor 41 is of value 2 megohms so there is very little power dissipated. Thus the circuit is in condition again to change state (PUT 43 to go on again) when capacitor 49 charges sufficiently.

As previously mentioned, when the beta of transistor 54 is greater than 300, the capacitor 51 is included to insure turn off. In operation, when capacitor 49 has substantially discharged, the current available via resistor 47 attempts to maintain the PUT 43 in the on condition. The high beta of transistor 54 receptive of this small current via the conduction path of transistor 54 tends to maintain current flowing in the PUT 43. However, in the present circuit, when the condition is reached to no current flowing out of capacitor 49, transistor 54 when of high $\beta$ is not in a saturated state and the voltage at its collector (the gate of the PUT 43) attempts to rise above its previous value. This action diverts a small fraction of the charge current (flowing from resistor 47) from the anode of the PUT to capacitors 49 and 51. Since the voltage at capacitor 49 cannot change instantaneously, this small current flows through capacitor 49 to resistor 55 and results in an increase in voltage across this resistor. This increased (more positive value of) voltage at the cathode of the PUT 43 turns off the PUT 43.

Temperature compensation is provided in the circuit of FIG. 2A, by the addition of resistor 41, which has a relatively high resistance (see Table 1). As already mentioned, resistor 41 insures that transistor 37 is slightly on even when PUT 43 is turned off. This insures that the voltage at the anode electrode of PUT 43 is equal to $V_R$ when the PUT is off, instead of being equal to $(V_R + 1V_{BE})$. $V_A = V_R$ because $(V_G = V_R - V_{BE})$ and $(V_A = V_G + V_{BE} = V_R)$. All of the transistors, in this example, are fabricated on the same integrated surface substrate, further enhancing the temperature compensation of the circuit. As a result, with the transistors matched, as the temperature of the substrate or ambient temperature changes, the condition $V_A = V_R$ will be maintained, preventing false triggering of PUT 43, by $V_A$ becoming $1V_{BE}$ greater than $V_G$.

In the circuit of FIG. 3A, a silicon-controlled-rectifier 59 and a PNP transistor 57 have been substituted for the PUT 43, and NPN transistor 37, respectively, of the circuit of FIG. 2A. As shown, all other components of the circuit of FIG. 3A are identical to and similarly connected as those of the circuit of FIG. 2A, with the only other difference being that the battery $V_B$ is now connected with its positive terminal to terminal 35, and its negative terminal to terminal 33. This relaxation oscillator circuit operates in substantially the same manner as the circuit of FIG. 2A, and provides an output waveform as partially shown in FIG. 3B. As shown, the output waveform from this circuit is merely the negative or inverse of the output signal of the circuit of FIG. 2A. The principle of operation of the circuit of FIG. 2A, as described in detail, is in general the same as the circuit of FIG. 3A. Also it should be noted that members of the thyristor family operating similarly to an SCR or PUT, or opposite conductivity discrete transistors interconnected to function as an SCR or PUT, can all be used in the inventive relaxation oscillator circuit.

What is claimed is:
1. A relaxation oscillator comprising:
   first and second terminals across which an operating voltage may be applied;
   resistive means;
   a solid-state switch having a control electrode receptive of a control voltage for operating said switch, and first and second electrodes defining a main current carrying path enabled by turn-on of said switch, said second electrode being connected to said second terminal through said resistive means;
   a source exhibiting a given source impedance for providing a reference voltage;
   impedance transformation means coupled between said source and said control electrode for applying said reference voltage to said control electrode at a substantially lower impedance level, relative to said control electrode, than exhibited by said source;
   a charging circuit connected between said two terminals, said circuit including a charge storage element for developing a voltage thereacross which increases as a function of time;
   a discharging circuit for said storage element comprising means for applying the voltage developed thereacross between said first electrode and said second terminal, said voltage causing said switch to turn on when it reaches a first value, and said switch turning off when said voltage reduces to a second value; and
   a regenerative feedback circuit comprising a capacitor coupled between said first and second electrodes for supplying current to said resistive means in a sense to turn off said solid-state switch, upon discharge of said charge storage element.

2. The relaxation oscillator of claim 1, wherein said solid-state switch comprises a programmable unijunction transistor, said control electrode comprising the gate electrode of said transistor, and said first and second electrodes comprising the anode and cathode electrodes, respectively of said transistor.

3. The relaxation oscillator of claim 1, wherein said solid-state switch comprises a silicon-controlled-rectifier, said control electrode comprising the gate electrode of said rectifier, said first and second main current carrying electrodes comprising the cathode and anode electrodes, respectively of said rectifier.

4. The relaxation oscillator of claim 1, wherein said source comprises a pair of resistors connected in series between said first and second terminals, said reference voltage being developed at the common connection of said resistors.

5. The relaxation oscillator of claim 1, wherein said impedance transformation means comprises:
a transistor connected as an emitter-follower having a base electrode receptive of said reference voltage, a collector electrode connected to said first power terminal, and an emitter electrode coupled to the control electrode of said switch.

6. The relaxation oscillator of claim 1, wherein said charging circuit comprises:
a resistor connected at one terminal to said first terminal, and wherein said charge storage element comprises a capacitor connected between the other terminal of said resistor and said second terminal, the connection between said resistor and capacitor being connected to said first electrode of said switch.

7. An oscillator comprising, in combination:
first and second operating voltage terminals;
a switch having first and second electrodes defining a current carrying path and a control electrode for controlling the conduction through said path;
load means connecting said second electrode of said switch to said second terminal;
a voltage divider connected between said terminals for producing a reference voltage at the output terminal thereof;
an emitter-follower comprising a transistor having base, emitter and collector electrodes and an emitter load, connected at its base electrode to said output terminal of said voltage divider, at its collector electrode to said first terminal and at its emitter electrode through said emitter load to said second terminal, said emitter electrode being coupled also to said control electrode;
a charging circuit comprising a charge storage means and impedance means connected in series between said first and second terminals, said circuit including an output terminal at which an output voltage is produced in a response to charging of said charge storage means;
a discharge circuit for said storage means comprising the current carrying path of said switch, said output terminal of said charging circuit being connected to said first electrode of said switch; and
a regenerative feedback connection between said first and second electrodes of said switch for applying a signal to said second electrode in a sense to turn off said switch in response to discharge of said charge storage means.

8. An oscillator as set forth in claim 7, wherein said impedance means comprises resistive means and said charge storage means comprises a capacitor, said output terminal being at the connection of the two.

9. An oscillator as set forth in claim 7, wherein said regenerative feedback connection comprises a capacitor.

10. An oscillator as set forth in claim 7, further including resistor means serving as the coupling from said emitter electrode to said control electrode.

11. An oscillator as set forth in claim 7, further including resistor means connected between the base and emitter electrode of said emitter follower.

12. An oscillator as set forth in claim 7, wherein said switch comprises a programmable unijunction transistor.

13. An oscillator as set forth in claim 7, wherein said switch comprises a silicon controlled rectifier.

* * * * *